United States Patent
Miyagi (10) Patent No.: US 6,515,907 B2
(45) Date of Patent: Feb. 4, 2003

(54) COMPLEMENTARY NON-VOLATILE MEMORY CIRCUIT

(75) Inventor: Masanori Miyagi, Chiba (JP)

(73) Assignee: Seiko Instruments Inc. (JP)

( * ) Notice: Subject to any disclaimer, the term of this patent is extended or adjusted under 35 U.S.C. 154(b) by 0 days.

(21) Appl. No.: 10/027,076

(22) Filed: Dec. 26, 2001

(65) Prior Publication Data

US 2002/0110022 A1 Aug. 15, 2002

(30) Foreign Application Priority Data

Feb. 13, 2001 (JP) .................................... 2001-035803

(51) Int. Cl.[7] .............................................. G11C 16/06
(52) U.S. Cl. ............................... 365/185.21; 365/185.24
(58) Field of Search ....................... 365/185.01, 185.05, 365/185.07, 185.08, 185.21, 185.24, 185.26, 185.29, 185.33

(56) References Cited

U.S. PATENT DOCUMENTS

| | | | | |
|---|---|---|---|---|
| 5,179,537 A | * | 1/1993 | Matsumoto | 365/185.21 |
| 5,471,422 A | * | 11/1995 | Chang et al. | 365/185.26 |
| 5,687,345 A | * | 11/1997 | Matsubara et al. | 365/185.01 |
| 5,812,452 A | * | 9/1998 | Hoang | 365/185.29 |
| 6,040,996 A | * | 3/2000 | Kong | 365/185.2 |

* cited by examiner

*Primary Examiner*—Trong Phan
(74) *Attorney, Agent, or Firm*—Adams & Wilks

(57) ABSTRACT

A non-volatile memory circuit has FLOTOX type memory elements operable with a low data writing voltage even when a difference between threshold voltages of non-volatile memory elements is small. Each data bit is held by two non-volatile memory elements for storing data having a complementary logic relationship. Potentials at data lines are supplied to inputs of a sense amplifier so that even a small potential difference can be detected. As a result, data stored in a pair of non-volatile FLOTOX type memory elements having shallow data writing depths can be read.

9 Claims, 5 Drawing Sheets

COMPLEMENTARY NON-VOLATILE MEMORY CIRCUIT

BACKGROUND OF THE INVENTION

1. Field of the Invention

The present invention generally relates to an electrically rewritable non-volatile memory circuit. More specifically, the present invention is directed to a FLOTOX type (Floating-gate Tunneling Oxide) non-volatile memory circuit capable of shortening data rewriting time.

2. Description of the Related Art

Figure 5:
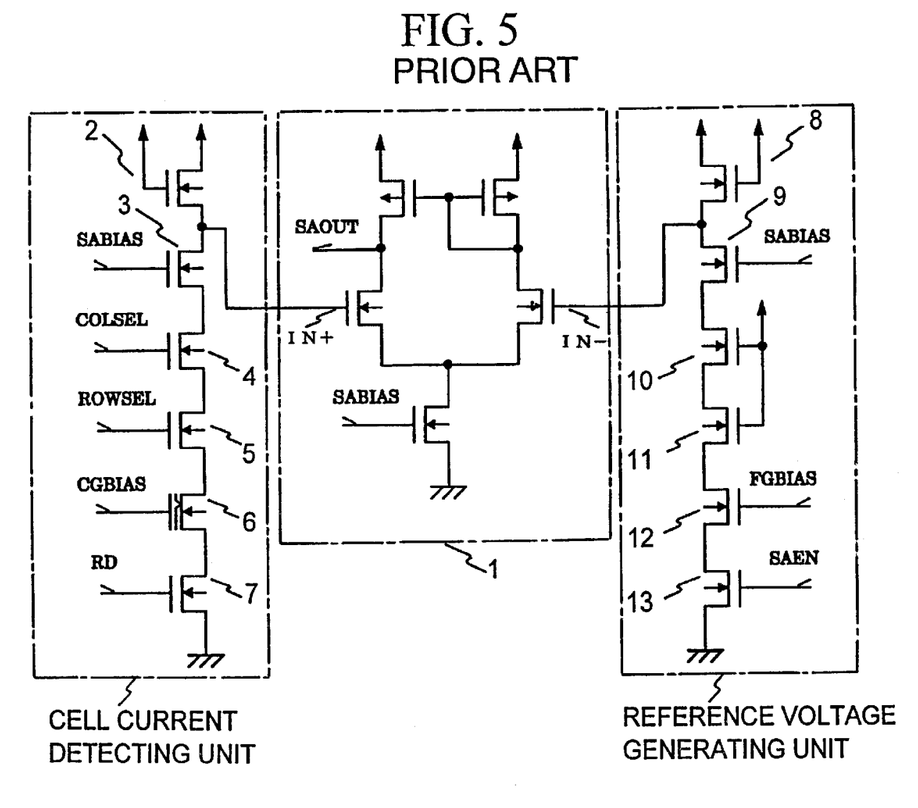
FIG. 5 is a circuit diagram for indicating the structure of the conventional non-volatile memory circuit.

One conventional FLOTOX type non-volatile memory is represented in FIG. 5. In this FLOTOX type non-volatile memory, a terminal voltage across one real memory element 6, and a terminal voltage across one dummy memory element 12, which are connected to current load circuits, are compared with each other by a sense amplifier circuit 1 constructed of a voltage comparing circuit in order to judge as to whether data is equal to "0" or "1."The sense amplifier circuit 1 receives a bias voltage SABIAS input to transistors 3 and 9. An output signal of the sense amplifier SAOUT represents the comparison result. Transistors 6, 12 receive bias signals CGBIAS and FGBIAS, respectively; whereas transistors 7, 12 receive bias signals RD and SAEN, respectively. The current load circuits are constituted by NMOS transistors 2 and 3, and NMOS transistors 8 and 9, respectively.

Referring to the drawing, operations of this conventional non-volatile memory circuit will be described.

The real memory element 6 may have two values, namely, an enhancement state and a depletion state. A voltage of "IN+" is changed, depending upon the state of this real memory element 6, and this "IN+" corresponds to an input node of the sense amplifier circuit 1 provided on the side of the real memory cell 6. As a result, this voltage is compared with a reference voltage of "IN−" corresponding to another input node of this sense amplifier circuit 1 provided on the side of the dummy cell in order to judge as to whether data is equal to "0" or "1."

At this time, a bias voltage (CGBIAS) is applied to a control gate of the real memory cell 6. This bias voltage is substantially equal to an intermediate value defined between a threshold voltage when the real memory cell 6 is brought into an enhancement state, and another threshold voltage when the real memory cell 6 is brought into a depletion state.

The real memory element 6 selects a desirable 1 bit from a large number of memory cells existing in an memory array by operating both a column selector transistor 4 with a signal COLSEL and a row selector transistor 5 with a signal ROWSEL. In this case, when a serial input/output type non-volatile memory is employed, a bit selecting transistor may be further additionally employed. Generally speaking, in the case where an array is constituted by using a FLOTOX type non-volatile memory, two elements made of one pair of both the real memory element 6 and the row selector transistor 5 (namely, select gate transistor) may function as a 1-bit memory cell.

In the case where data is written into an FLOTOX type memory cell, when the memory cell is brought into an enhancement state, a control gate is set to a high voltage of 18 V to 22 V and also a drain is set to 0 V, so that electrons are injected into a floating gate via a tunnel oxide film having a thickness of on the order of 80 to 120 angstrom by utilizing an FN (Fowler-Nordheim) tunnel current. In order to bring the memory cell to a depletion state, the control gate is set to 0 V and the drain is set to [such] a high voltage such as 18 to 22 V, so that holes are injected into the floating gate by similarly utilizing an FN tunnel current.

An FN tunnel current starts to flow when an electric field of approximately 10 to 12 V is applied to a tunnel oxide film, while this flow of the FN tunnel current is determined depending upon a thickness of the tunnel oxide film.

At this time, in order to bring the memory cell to the depletion state, once this memory cell is brought into the enhancement state, and thereafter, a high voltage must be applied to the drain in order to avoid a leak occurred between the source and the drain during data writing operation. When data is written into a memory cell, since no clear definition is made that what data has been previously written into this memory cell, as a write sequence, a so-called "erase cycle" is executed. That is, at the beginning, the memory cell must be brought into the enhancement state without any exception. Thereafter, a high voltage is applied only to such a drain of a memory cell which will be brought into the depletion state in a so-called "write cycle."

Generally speaking, when data are successively rewritten into an FLOTOX type non-volatile memory, a film quality of a tunnel oxide film thereof is deteriorated, a difference between a threshold value of an enhancement state and a threshold value of a depletion state is gradually decreased. Finally, this tunnel oxide film is broken, so that data cannot be written and read. Also, in such a memory cell into which data has been written, electron charges which have been stored in a floating gate are gradually extracted. In particular, under high temperature condition, these electron charges apparently disappear. As a result, a difference between a threshold voltage of an enhancement state and a threshold voltage of a depletion state becomes small, and data cannot be finally read by a sense amplifier. As a consequence, when data is written into the non-volatile memory, the data should be deeply written in such a manner that the difference between the threshold voltages of both the enhancement state and the depletion state may become sufficiently large by considering these conditions. At this time, both a data rewritable time and a data writing depth may depend upon a high voltage which is applied when data is written. When the data write voltage is increased, the data write depth becomes sufficiently deep, and also margin used to be read by the sense amplifier is increased. However, stress given to the tunnel oxide film is increased, and a total data rewritable time is decreased. To the contrary, when the data write voltage is decreased, since stress applied to the tunnel oxide film is reduced, a total data rewritable time is increased. However, the data write depth.becomes shallow. In other words, since a difference between the threshold voltages of the depletion state and the enhancement state is small, such a difference between an input voltage entered into a sense amplifier provided on the side of a real memory cell, and another input voltage entered into another sense amplifier provided on the side of a dummy cell is decreased. As a result, a data reading speed is delayed. In the worst case, the data cannot be read out from the non-volatile memory.

Since there is such a trade-off relationship between the total data rewritable time and the data write depth, the conventional FLOTOX type non-volatile memory owns such a limitation. That is, the high voltage used to write the data is selected to be 18 V to 22 V, and a total data rewritable time is limited to 100,000 times up to 1,000,000 times.

Also, since the.conventional non-volatile memory requires two sequences constructed of an erase cycle and a write cycle in order to write data into this non-volatile memory, data writing time is prolonged.

SUMMARY OF THE INVENTION

The present invention has been made to solve the above-described problems, and therefore, has an object to provide a non-volatile memory circuit. That is, a non-volatile memory circuit according to a first aspect of the present invention is featured by such a non-volatile memory circuit using FLOTOX type electrically rewritable non-volatile memory elements comprising: a first data line to which a drain electrode of a first non-volatile storage element is connected via at least a first single e selection transistor; and a second data line to which a drain of a second non-volatile storage element is connected via at least a second single selection transistor; in which: a gate electrode of the first non-volatile storage element is connected to the drain electrode of the second non-volatile memory element; a gate electrode of the second non-volatile memory element is connected to the drain electrode of the first non-volatile memory element; the first data line is connected to both first current load circuit and a first input terminal of a sense amplifier circuit; the second data line is connected to both a second current load circuit and a second input terminal of the sense amplifier circuit; both a source electrode of the first non-volatile memory element and a source electrode of the second non-volatile memory element are connected via switching transistors to the ground potential, respectively; and 1-bit data is stored by employing both the first non-volatile memory element and the second non-volatile memory element in such a manner that positive and negative logic states which continuously constitute a complementary pair are stored. As a consequence, even when a difference between a threshold voltage of the non-volatile memory element under depletion state and a threshold voltage of the non-volatile memory element under enhancement state is small, data can be surely read therefrom in a high speed.

Also, a non-volatile type memory circuit according to a second aspect of the present invention is featured by such an FLOTOX type non-volatile memory circuit comprising the first non-volatile memory element, the second non-volatile memory element, the first data line, and the second data line, in which; when data is written, complementary voltages are applied to both the first data line and the second data line in such a manner that a high voltage higher than, or equal to 10 v is applied to one of these first and second data lines whereas a voltage of 0 V is applied to the other data line, whereby positive and negative logic states which constitute complementary pair are stored into both the first non-volatile memory element and the second non-volatile memory element. As a consequence, as to such a memory cell which becomes a depletion state when the data is written, the previous state of this memory cell is necessarily the enhancement state, so that the erase cycle is no longer required, and thus, the data can be written in the high speed.

A non-volatile memory circuit according to a third aspect of the present invention is featured by such a non-volatile memory circuit using FLOTOX type electrically rewritable non-volatile memory elements comprising: a first data line to which a drain electrode of a first non-volatile memory element is connected via at least a first single selection transistor; and a second data line to which a drain of a second non-volatile memory element is connected via at least a second single selection transistor; in which: a gate electrode of the first non-volatile memory element is connected to the drain electrode of the second non-volatile memory element; a gate electrode of the second non-volatile memory element is connected to the drain electrode of the first non-volatile memory element; the first data line is connected to a first input terminal of a latch circuit; the second data line is connected to a second input terminal of the latch circuit; both a source electrode of the first non-volatile memory element and a source electrode of the second non-volatile memory element are connected via switching transistors to the ground potential, respectively; and 1-bit data is stored by employing both the first non-volatile memory element and the second non-volatile memory element in such a manner that positive and negative logic states which continuously constitute a complementary pair are stored. As a consequence, since both the circuit for controlling the high voltage used to write the data and the latch circuit for temporarily latching the data can be commonly used, the data can be written in a simple operation. Also, in the case where the memory cell owns the sufficiently high current driveability, the sense amplifier circuit used to read the data is no longer required, so that the circuit structure can be made simple.

Also, a non-volatile type memory circuit according to a fourth aspect of the present invention is featured by such an FLOTOX type non-volatile memory circuit comprising the first non-volatile memory element, the second non-volatile memory element, the first data line, and the second data line, in which; a power supply voltage applied to the latch circuit is selected to be such a higher voltage than, or equal to 10 V; when data is written, complementary voltages are applied to both the first data line and the second data line in such a manner that a high voltage higher than, or equal to 10 V is applied to one of these first and second data lines whereas a voltage of 0 V is applied to the other data line, whereby positive and negative logic states which constitute complementary pair are stored into both the first non-volatile memory element and the second non-volatile memory element. As a consequence, as to such a memory cell which becomes a depletion state when the data is written, the previous state of this memory cell is necessarily the enhancement state, so that the erase cycle is no longer required, and thus, the data can be written in the high speed.

Also, a non-volatile type memory circuit according to a fifth aspect of the present invention is featured by such an FLOTOX type non-volatile memory circuit comprising the first non-volatile memory element, the second non-volatile memory element, the first data line, and the second data line, in which; when the data is written, the high voltage which is applied to the data lines and the control gate is selected to be higher than, or equal to 12 V, and lower than, or equal to 18 V. The high voltage which is applied to the tunnel oxide film is made lower than that of the prior art, so that the stress produced when the data is written is reduced. As a result, a total data rewritable time can be made larger than that of the conventional non-volatile memory circuit.

BRIEF DESCRIPTION OF THE DRAWINGS

For a better understanding of the present invention, reference is made of a detailed description to be read in conjunction with the accompanying drawings, in which.

DETAILED DESCRIPTION OF THE PREFERRED EMBODIMENT

Referring now to the attached drawings, non-volatile memory circuits according to Embodiments 1 through 4 of the present invention will be described in detail. In FIGS. 1–4, the same reference symbols are used to designate the same elements and signals as shown in FIG. 5. Accordingly, a detailed description thereof will be omitted.

Embodiment 1

Figure 1:
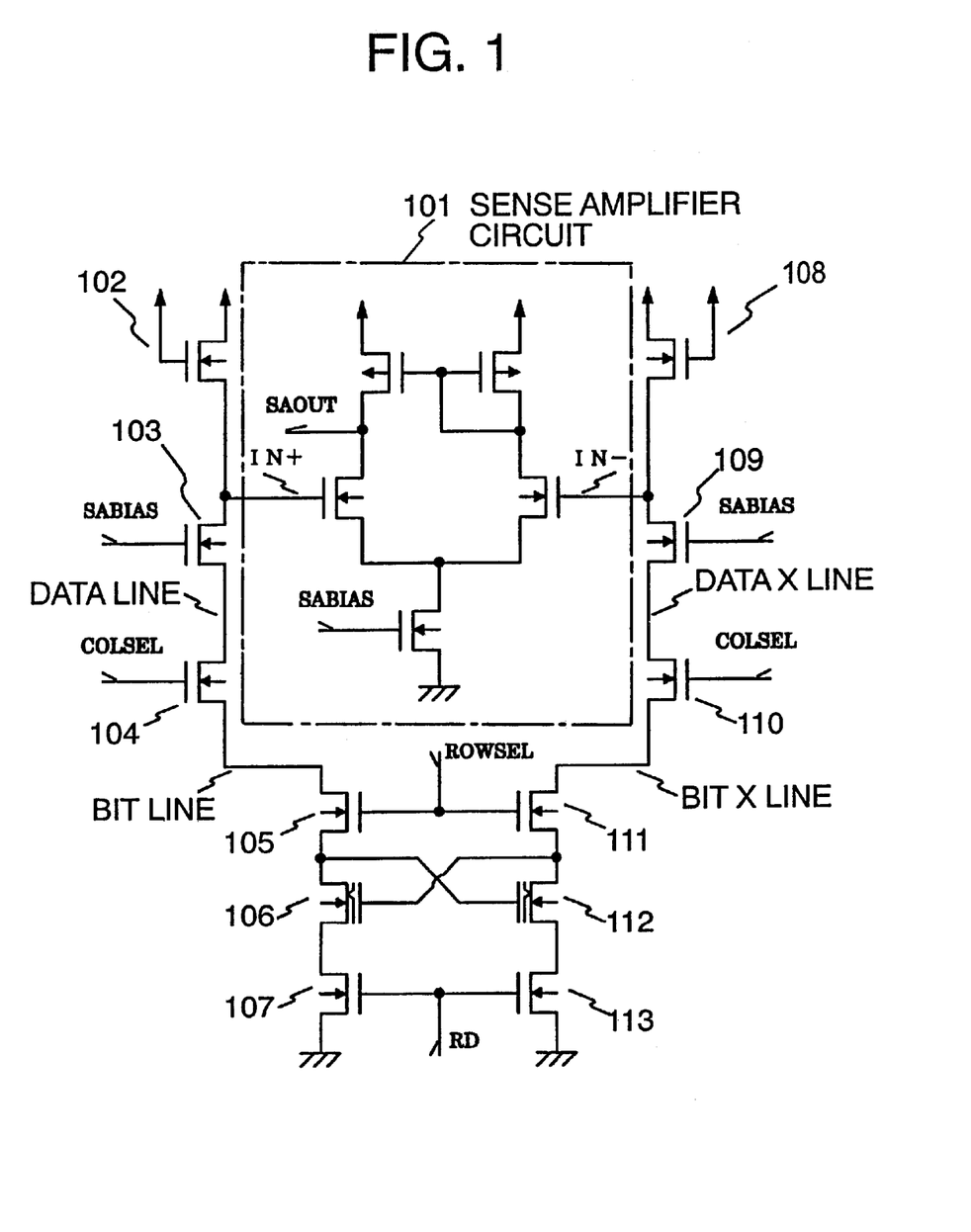
FIG. 1 is a circuit diagram for representing a structure of a non-volatile memory circuit according to Embodiment 1 of the present invention.

FIG. 1 is a circuit diagram for indicating an internal structure of a non-volatile memory circuit according to Embodiment 1 of the present invention.

In accordance with the present invention, a memory cell used to store thereinto 1-bit data is arranged in such a manner that both a first FLOTOX type non-volatile memory element 106 and a second FLOTOX type non-volatile memory element 112 constitute one pair, and this 1-bit data is stored in such a way that when one of these first and second FLOTOX type non-volatile memory elements 106 and 112 is brought into a depletion state, the other memory element is brought into an enhancement state. It should be noted that although only one pair of memory cells is represented in the non-volatile memory circuit of FIG. 1, a large number of pairs of memory cells are actually provided therein, and a desirable memory cell pair may be selected by operating both column select transistors 104/110, and row select transistors 105/111.

When data is read from this non-volatile memory circuit, a desirable memory cell pair is selected by operating both the column select transistors 104/110 and the row select transistors 105/111, and also, a current is supplied to the memory cells by both a first current load circuit and a second current load circuit. The first current load circuit is constituted by NMOS transistors 102 and 103, whereas the second current load circuit is constituted by NMOS transistors 108 and 109. When data is read out, while a level of an RD signal is set to an "H" level, NMOS transistors 107 and 113 are brought into ON states, so that such a path is formed by which a current may flow through the memory cell.

While a constant voltage SAB/AS of approximately 2 V is applied to both gate electrodes of the NMOS transistors 103 and 109 of the first and second current load circuits, the voltage is clamped in order that when the data is read, an excessively high voltage is applied to a Bit line, a BitX line, a Data line, and also a DataX line, and thus, electron charges stored in the memory cell are not extracted.

At this time, for instance, when the non-volatile memory element 106 is brought into the depletion state and the non-volatile memory element 112 is brought into the enhancement state, potentials of the Bit line and the Data line shown in the drawing become lower than those of the BitX line and the DataX line indicated in the drawing, because a current flows through the non-volatile memory element 106, so that a sense amplifier circuit 101 outputs a signal having an "H" level. Since a gate electrode of the non-volatile memory element 106 under depletion state is connected to a drain electrode of the non-volatile memory element 112 under the enhancement state, and no current flows through this non-volatile memory element 112, the potential of the BitX line is increased so as to bias the gate electrode of the non-volatile memory element 106. As a result, the non-volatile memory element 106 can cause a current to more easily flow therethrough, so that the potentials of both the Bit line and the Data line are furthermore approximated to 0 V. Conversely, since a gate electrode of the non-volatile memory element 112 under the enhancement state is furthermore approximated to 0 V, such a positive feedback is established that this non-volatile memory element 112 can hardly cause a current to flow therethrough. As a consequence, even in such a case that the data writing operations of these non-volatile memory elements 106 and 112 are shallow and a difference between threshold voltages thereof is small, the data can be read in a high speed because such a positive feedback is established.

In such a case that the non-volatile memory element 106 is brought into the enhancement state and also the non-volatile memory element 112 is brought into the depletion state, a potential relationship among the Bit line and the Data line, the BitX line, and the DataX line is established in an opposite sense to the above-explained potential relationship. Thus, the sense amplifier circuit 101 outputs a signal having an "L" level.

Embodiment 2

Figure 2:
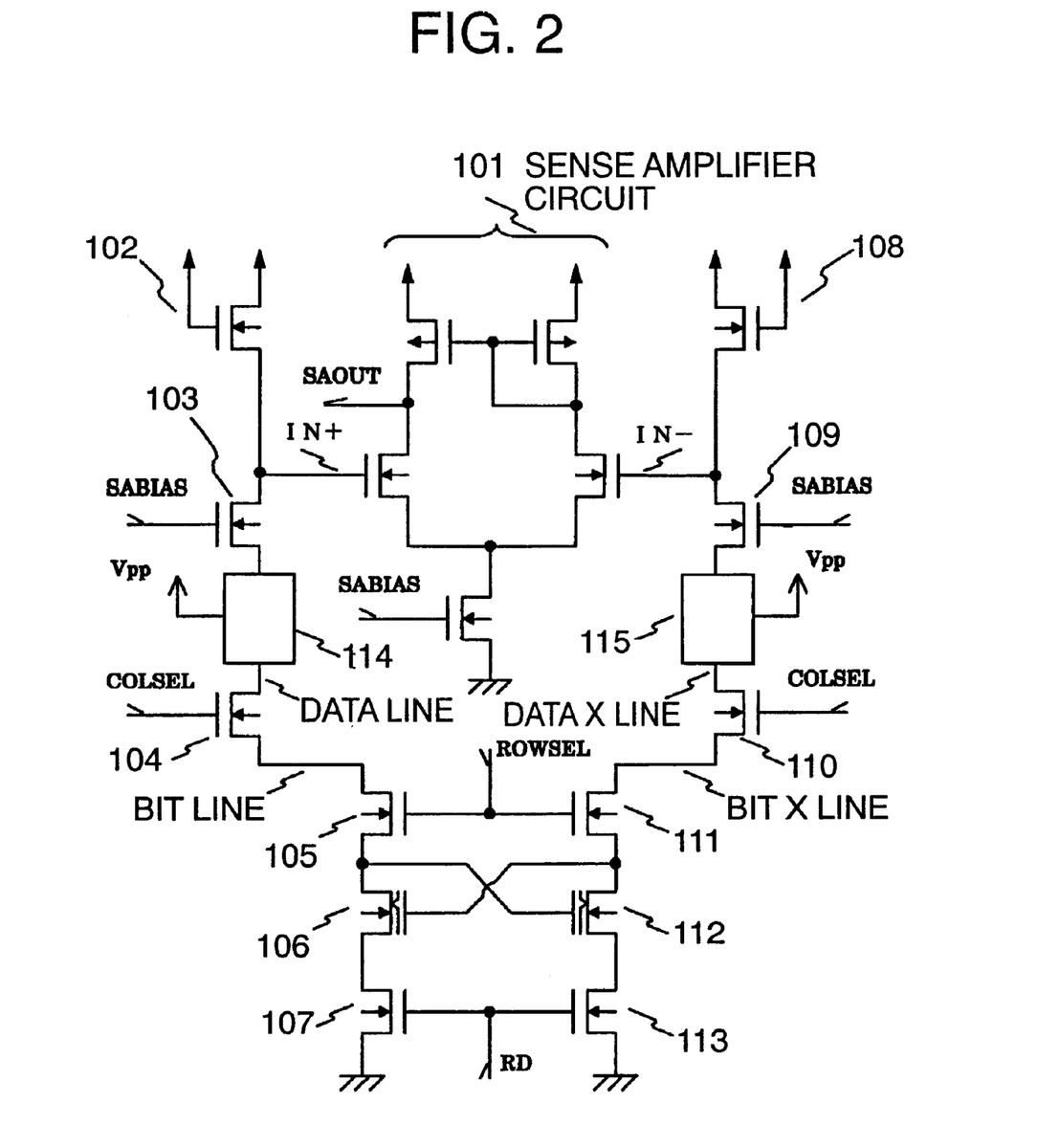
FIG. 2 is a circuit diagram for showing a structure of a non-volatile memory circuit according to Embodiment 2 of the present invention.

FIG. 2 is a circuit diagram for indicating an internal structure of a non-volatile memory circuit according to Embodiment 2 of the present invention.

Both write control circuits 114 and 115 are additionally provided with the non-volatile memory circuit of Embodiment 1, and these write control circuits 114 and 115 may control high voltages (Vpp) used to write data into the non-volatile memory circuit of Embodiment 2.

When data is written into this non-volatile memory circuit, a level of an RD signal is set to an "L" level so as to bring both an NMOS transistor 107 and another NMOS transistor 113 into OFF states, and to cut a path in which a current flow through a source side of a memory cell. When a potential of the Data line is brought into a high voltage, the DataX line is set to 0 V, whereas when a potential of the Data line is brought into 0 V, the DataX line is set to a high voltage, so that complementary data are written into both the non-volatile memory element 106 and the non-volatile memory element 112. At this time, as to the high voltages applied to both the Data line and the DataX line, at least 10 V, or more high voltage is required in order to supply an FN tunnel current, although this high voltage may depend upon a thickness of a tunnel oxide film.

In FIG. 2, no detailed contents of the write control circuits 114 and 115 capable of controlling the high voltages for writing the data are not shown. However, precisely speaking, these write control circuits 114 and 115 perform the write control in such a manner that while a current load circuit for reading data is electrically separated, such a high voltage (Vpp) used to write data is applied to such a data line (namely, either Data line or DataX line) to which a drain of a non-volatile memory element is connected. This non-volatile memory will be brought into a depletion state.

Since source electrodes of both the non-volatile memory elements 106 and 112 become high impedances, the data writing operation may be accomplished within one high-voltage-application cycle irrespective of a state of a memory cell before data is written. As a consequence, the data can be rewritten within a short time period, as compared with that of the conventional FLOTOX type non-volatile memory circuit.

Embodiment 3

Figure 3:
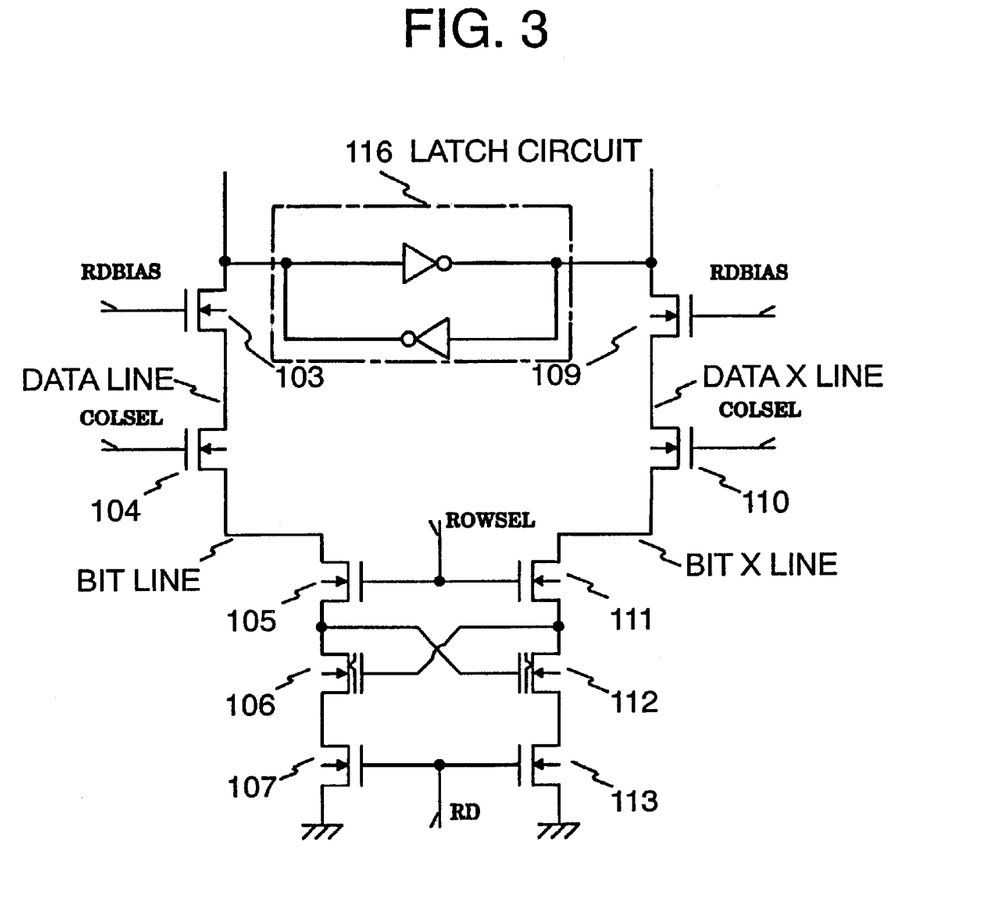
FIG. 3 is a circuit diagram for showing a structure of a non-volatile memory circuit according to Embodiment 3 of the present invention.

FIG. 3 is a circuit diagram for indicating an internal structure of a non-volatile memory circuit according to Embodiment 3 of the present invention.

In the case where data is written in the non-volatile memory circuit of Embodiment 3, desirable data is once latched by a latch circuit 116 at a voltage (Vcc) lower than, or equal to 10 V, and then, since a power supply voltage of the latch circuit is increased up to a high voltage (Vpp), this data may be stored in a memory cell.

When data is read, a difference between potentials of both a Data line and a DataX line may be read by a sense amplifier circuit in a similar manner to that of the embodiment 1. In such a case that a non-volatile memory element operated under depletion state owns sufficiently high current driveability, and also, data latched by the latch circuit 116 can be inverted, the sense amplifier circuit is no longer required, and also, both a latch circuit for writing data and a data reading circuit may be commonly used to be made simple. Such a signal called as "RDBIAS" which is applied to gate electrodes of NMOS transistors 103 and 109 which separate the latch circuit 116 from both the Data line and the DataX line, is selected to be approximately 2 V similar to the embodiment 1 when data is read. While electron charges stored into a memory cell are not unnecessarily extracted, the desirable data is read out from the memory cell. When data is written, the RDBIAS signal is increased up to the high voltage (Vpp) in order to control so that the voltage Applied to the memory cell is not clamped.

Embodiment 4

Figure 4:
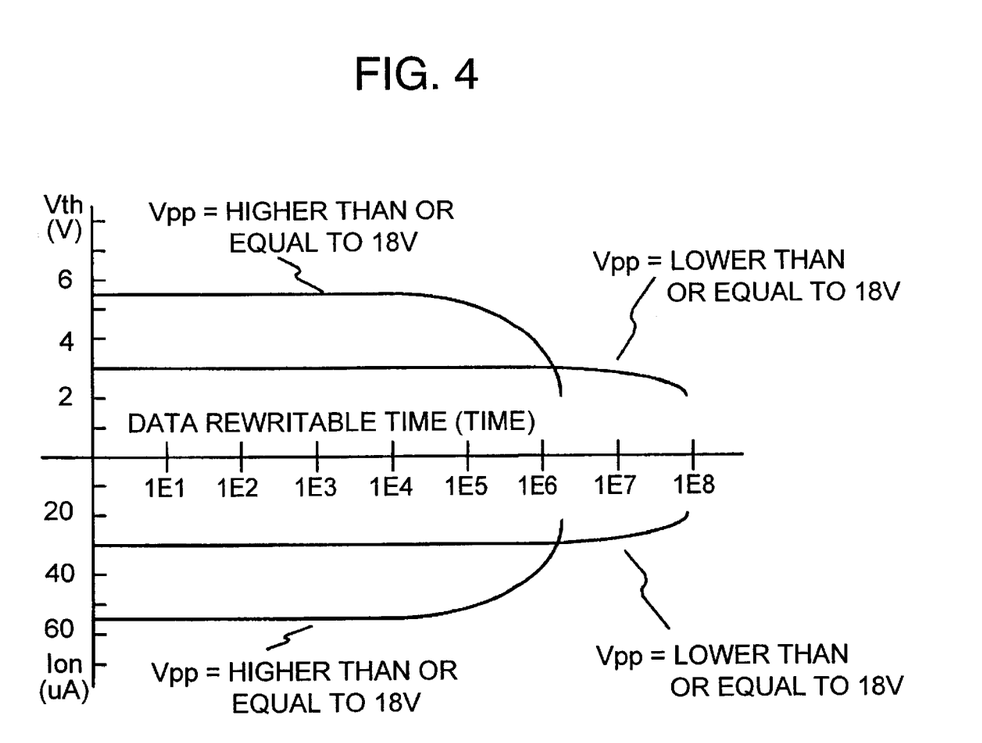
FIG. 4 is a graphic representation for graphically representing a rewriting characteristic of a non-volatile memory element according to Embodiment 4 of the present invention.

FIG. 4 is a graphic representation for graphically showing a rewrite characteristic of a non-volatile memory circuit according to Embodiment 4 of the present invention. An abscissa of this graphic representation shows a data rewriting time, whereas an upper half portion of an ordinate denotes a threshold voltage when a memory element is brought into an enhancement state, and also a lower half portion of this ordinate indicates a value of a current which may be supplied when the memory element is brought into a depletion state. In general, when a data write voltage (Vpp) of an FLOTOX type non-volatile memory is lowered, since stress applied to a tunnel oxide film is decreased, a total data rewritable time is increased. Instead, a data write depth becomes shallow, a threshold voltage is low when the FLOTOX type non-volatile memory is brought into an enhancement state, and also a current value thereof is decreased when this non-volatile memory is brought into a depletion state.

In the conventional FLOTOX type non-volatile memory circuit, the data write voltage (Vpp) is selected to be higher than, or equal to 18 V in order to secure a sufficiently high threshold voltage and also margin of a cell current. To the contrary, in accordance with this embodiment, while the data write voltage (Vpp) is selected to be lower than, or equal to 18 V, stress with respect to the memory cell can be lowered, and further, a total data rewriting time can be increased.

In the conventional memory cell structure and sense amplifier circuit, when the data write depth is shallow, the data reading speed becomes slow, or the data cannot be read out from the memory cell in the worst case. To the contrary, as explained in the non-volatile memory circuit of this embodiment, since the data having the complementary relationship with each other are inputted to the sense amplifier circuit, even when the data write depth is shallow, a sufficiently high potential difference may be produced at the inputs of the sense amplifier circuit. As a consequence, the data can be firmly read from the memory cell in a high speed.

Similarly, in this embodiment, it is desirable that the data is written at the data write voltage of vpp which is higher than, or equal to 12 V and lower than, or equal to 18 V in order that the electron charges are injected and/or extracted via the tunnel oxide film with respect to the floating gate by using the FN tunnel current within a practical time duration.

As previously described in detail, in accordance with the non-volatile memory circuit of the present invention, while two sets of 1-bit cells are prepared in this non-volatile memory circuit, the data having the complementary relationship with each other are written into these two cells. As a consequence, the data can be read out from the cells in high speeds, and further, the high-voltage data writing voltage can be selected to be lower than that of the conventional non-volatile memory circuit. Also, the total data rewritable time can be increased, as compared with that of the conventional non-volatile memory circuit. Furthermore, since the erase cycle is no longer required in the non-volatile memory circuit of the present invention, a single high-voltage data writing time may be shortened. This erase cycle is carried out in the conventional non-volatile memory circuit when the data is rewritten, namely, the non-volatile memory element under operation is once brought into the enhancement state.

What is claimed is:

1. A non-volatile memory circuit using FLOTOX type electrically rewritable memory elements, comprising:
   a first data line to which a drain electrode of a first non-volatile memory element is connected via at least a first single selection transistor; and
   a second data line to which a drain electrode of a second non-volatile memory element is connected via at least a second single selection transistor;
   wherein a gate electrode of the first non-volatile memory element is connected to the drain electrode of the second non-volatile memory element;
   a gate electrode of the second non-volatile memory element is connected to the drain electrode of the first non-volatile memory element;
   the first data line is connected to both a first current load circuit and a first input terminal of a sense amplifier circuit;
   the second data line is connected to both a second current load circuit and a second input terminal of the sense amplifier circuit;
   a source electrode of the first non-volatile memory element and a source electrode of the second non-volatile memory element are connected via switching transistors to ground potential, respectively; and
   one data bit is stored by the non-volatile memory circuit by respectively storing a complementary pair comprising a positive and a negative logic state in the first non-volatile memory element and the second non-volatile memory element.

2. A non-volatile memory circuit according to claim 1; wherein when data is written, complementary voltages are applied to the first data line and the second data line such that a voltage greater than or equal to 10 V is applied to one of the first and second data lines and a voltage of 0 V is applied to the other one of the first and second data lines to store the positive and negative logic states of the complementary pair in the first non-volatile memory element and the second non-volatile memory element.

3. A non-volatile memory circuit using FLOTOX type electrically rewritable memory elements, comprising:
- a first data line to which a drain electrode of a first non-volatile memory element is connected via at least a first single selection transistor; and
- a second data line to which a drain electrode of a second non-volatile memory element is connected via at least a second single selection transistor;
- wherein a gate electrode of the first non-volatile memory element is connected to the drain electrode of the second non-volatile memory element;
- a gate electrode of the second non-volatile memory element is connected to the drain electrode of the first non-volatile memory element;
- the first data line is connected to a first input terminal of a latch circuit;
- the second data line is connected to a second input terminal of the latch circuit;
- a source electrode of the first non-volatile memory element and a source electrode of the second non-volatile memory element are connected via switching transistors to ground potential, respectively; and
- one data bit is stored by the non-volatile memory circuit by respectively storing a complementary pair comprising a positive and a negative logic state in the first non-volatile memory element and the second non-volatile memory element.

4. A non-volatile memory circuit according to claim 3; wherein a power supply voltage applied to the latch circuit is greater than or equal to 10 V; and when data is written, complementary voltages are applied to the first data line and the second data line such that a voltage greater than or equal to 10 V is applied to one of the first and second data lines and a voltage of 0 V is applied to the other one of the first and second data lines to store the positive and negative logic states of the complementary pair in the first non-volatile memory element and the second non-volatile memory element.

5. A non-volatile type memory circuit according to claim 2; wherein when the data is written, the voltage which is applied to the data lines is greater than or equal to 12 V and less than or equal to 18 V.

6. A non-volatile memory circuit comprising: a first non-volatile FLOTOX type electrically rewritable memory element; a second non-volatile FLOTOX type electrically rewritable memory element, a gate electrode of the first non-volatile memory element being connected to a drain electrode of the second non-volatile memory element, a gate electrode of the second non-volatile memory element being connected to a drain electrode of the first non-volatile memory element, and the first and second non-volatile memory elements having source electrodes connected via switching transistors to ground potential; a first data line connected to the drain electrode of the first non-volatile FLOTOX memory element via a first transistor; a second data line connected to the drain electrode of the second non-volatile memory element via a second transistor; a sense amplifier circuit having a first input terminal connected to the first data line and a second input terminal connected to the second data line; a first current load circuit connected to the first data line; and a second current load circuit connected to the second data line; wherein one data bit is stored in the non-volatile memory circuit by respectively storing a complementary logic pair comprising a positive logic state and a negative logic state in the first non-volatile memory element and the second non-volatile memory element.

7. A non-volatile memory circuit according to claim 6; wherein complementary voltages are applied to the first data line and the second data line when data is being written to the non-volatile memory circuit such that a voltage greater than or equal to 10 V is applied to one of the first and second data lines and a voltage of 0 V is applied to the other one of the first and second data lines to store the positive and negative logic states of the complementary pair.

8. A non-volatile memory circuit according to claim 7; wherein the voltage which is applied to the data lines when data is to be written is greater than or equal to 12 V and less than or equal to 18 V.

9. A non-volatile memory circuit according to claim 6; further comprising a first latch circuit having a first input terminal connected to the first data line and a second input terminal connected to the second data line.

* * * * *